United States Patent
Somayajula et al.

(10) Patent No.: US 9,385,593 B2
(45) Date of Patent: Jul. 5, 2016

(54) SUSPEND MODE IN CHARGE PUMP

(71) Applicant: STMicroelectronics International N.V., Amsterdam (NL)

(72) Inventors: Shyam Somayajula, Bangalore (IN); Sri Ram Gupta, Bangalore (IN); Lionel Cimaz, Pleumeleuc (FR)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/482,714

(22) Filed: Sep. 10, 2014

(65) Prior Publication Data

US 2015/0070090 A1    Mar. 12, 2015

(30) Foreign Application Priority Data

Sep. 11, 2013   (EP) ..................... 13183984

(51) Int. Cl.
| | |
|---|---|
| *H04R 3/00* | (2006.01) |
| *H03F 3/217* | (2006.01) |
| *H02M 3/07* | (2006.01) |
| *H03F 3/187* | (2006.01) |
| *H03F 3/45* | (2006.01) |
| *H02M 1/00* | (2006.01) |

(52) U.S. Cl.
CPC ............. *H02M 3/07* (2013.01); *H03F 3/187* (2013.01); *H03F 3/45475* (2013.01); *H02M 2001/0032* (2013.01); *H02M 2001/0035* (2013.01); *H03F 2200/03* (2013.01); *Y02B 70/16* (2013.01)

(58) Field of Classification Search
USPC ............... 330/297, 136; 381/120; 363/41; 323/282
See application file for complete search history.

(56) References Cited

U.S. PATENT DOCUMENTS

| | | | |
|---|---|---|---|
| 6,642,774 B1 | 11/2003 | Li | |
| 8,605,915 B2 * | 12/2013 | Wang | H03F 1/0244 330/297 |
| 2002/0153869 A1 | 10/2002 | Kurotsu | |
| 2005/0189984 A1 | 9/2005 | Kawagoshi | |
| 2007/0139099 A1 | 6/2007 | Pan | |
| 2008/0290949 A1 | 11/2008 | Chen et al. | |
| 2013/0272547 A1 * | 10/2013 | Waller, Jr. | H03F 1/0233 381/120 |

FOREIGN PATENT DOCUMENTS

| | | |
|---|---|---|
| GB | 2486701 A | 6/2012 |
| WO | WO-2011015578 A1 | 2/2011 |

OTHER PUBLICATIONS

EP Search Report and Written Opinion for EP13183984 dated Feb. 14, 2014 (8 pages).

* cited by examiner

*Primary Examiner* — Hieu Nguyen

(74) *Attorney, Agent, or Firm* — Gardere Wynne Sewell LLP

(57) ABSTRACT

A device may be associated with a power source. The device may include a charge pump configured to output a pulse-width modulated voltage based upon an input voltage from the power source, with the pulse-width modulated voltage varying between a first voltage and a second voltage. The device may also include a low-pass filter comprising an output capacitor, with the output capacitor being configured to average the pulsed-width modulated voltage and to output a filtered voltage having a value different than that of the input voltage. The device may further include a controller configured to selectively decouple the charge pump from the power source when a load imposed on the low-pass filter is below a threshold load.

17 Claims, 6 Drawing Sheets

SUSPEND MODE IN CHARGE PUMP

RELATED APPLICATION

This application claims the benefit of European Patent Application No. 13183984.7, filed Sep. 11, 2013, titled "SUSPEND MODE IN CHARGE PUMPS FOR AUDIO CIRCUITS", the contents of which are hereby incorporated by reference to the maximum allowable extent under the law.

TECHNICAL FIELD

This disclosure generally relates to a voltage supply circuit for an electronic device. It finds application, in particular, in electronic devices such as mobile phones, mobile computers, digital personal assistants (PDA), digital audio players, and other mobile devices.

BACKGROUND

Certain electronic devices may be supplied by a power source supplying a positive supply voltage. An audio signal generated by an audio device is a modulated signal with a rough mean voltage, called "common mode voltage", that is generally positive, e.g. 1.2 V.

Headphones may be arranged so that the common mode voltage is equal to the ground voltage so as to ease driving of the headphones. If a speaker of such headphones receives an input signal having a common mode voltage different from the common mode voltage of the headphone, damage may occur to the speakers' cones.

For this reason, some audio devices may be configured for outputting an audio signal compatible with such headphones, that is to say, with a common mode voltage equal to the ground voltage.

Outputting a signal with a common mode voltage equal to the ground voltage may imply the use of both a source of negative voltage and a source of positive voltage. However, as already stated above, audio devices, especially in mobile devices, are generally provided with a power source that provides a positive supply voltage. A source of negative supply voltage may be desired. Such a negative supply source may include a negative charge pump, such as an inverter.

In certain charge pumps, a ground voltage is output to an output terminal in a first operating mode called charging mode, while electrical charge is stored into at least one capacitor. In a second operating mode called discharging mode, a negative voltage may be output by adequately coupling the capacitor to the output terminal. The charge pump thus outputs a pulse-width-modulated (PWM) signal, switching with a given switching frequency between the ground voltage output during the charging mode and the negative voltage output during the discharging mode. By coupling the output terminal of the charge pump to the input of a low-pass filter, adapted to filter the switching frequency, the PWM signal is averaged and the low pass filter outputs a continuous negative voltage.

The charge pump and the low pass filter form a charge pump assembly that is adapted to output a continuous filtered voltage. A −2 V negative voltage may thus be obtained.

However, there may be some challenges with such a technique. A charge pump may continuously use power when operating because a small current is dissipated in the succession of charging and discharging modes of the charge pump. For example, in the charging mode, some current is sunk to ground, while during the discharging mode, current is provided to a load as the load demands it.

Thus, the aforementioned small current, called "quiescent current", may be dissipated even if no power is output by the charge pump assembly. The quiescent current of a charge pump depends both on the switching frequency and on the capacitance of the charge pump's capacitor.

Charge pumps are usually designed so as to be able to cope with unusual loads. Such unusual loads may be worst cases loads in which the headphone demands a relatively high current and a relatively high negative voltage from the charge pump. An unusual load may be used in audio devices when a loud sound is to be emitted from the speakers. Accordingly, the switching frequency and the capacitance of the capacitor of the charge pump are chosen to be high enough for the charge pump to be able to comply with demands for such unusual loads.

If the audio device is designed for supplying speakers adapted to produce loud sounds, it may desirably have a charge pump able to cope with unusual loads; accordingly the quiescent current of the charge pump is of interest.

A normal audio signal has an amplitude that is generally less than to 50% of the amplitude of worst-case signals. Thus, for most of the life of an audio device, the output audio signal is such that the audio device imposes on the charge pump assembly a load less than 50% of the worse-case load on the charge pump. Accordingly, the charge pump may be over-designed compared to its normal use.

As the quiescent current depends on worst-case assumptions of the load imposed on the charge pump, the quiescent current is of more interest than justified by a normal use of the audio device.

There is thus a desire for improved devices that reduce the power consumption of audio devices, and especially those that reduce the quiescent current.

SUMMARY

To address the above, a first aspect of the present disclosure relates to a device in which the charge pump consumes as small an amount as possible current. One embodiment of the disclosure is to decouple the charge pump from the power source as much as possible. In a charge pump assembly, a filter is generally positioned at the output of the charge pump. The filter generally comprises an output capacitor, positioned in parallel with the charge pump.

The charge pump, in a discharging mode, may output a given voltage to the output capacitor, and output in a charging mode another voltage.

The output capacitor may be used to store the voltages output by the charge pump and output a time-average voltage, called a filtered voltage, to an output of the charge pump assembly.

This disclosure proposes to selectively decouple the charge pump from its power source. As the charge pump is decoupled from the power source, quiescent current may not be used. Further, during such a period, the output capacitor may output a voltage that depends on the voltages previously fed to it by the charge pump.

Accordingly, an embodiment of the disclosure particularly relates to a device that may have a charge pump, CP, with an input and an output, arranged to output a Pulse-Width Modulated, PWM, voltage out of an input voltage coming from a power source, with the PWM signal varying between a first voltage and a second voltage. Further, the device may include a low-pass filter comprising an output capacitor, the output capacitor being arranged to average the PWM voltage and output a given voltage (the filtered voltage). Further the device may include a controller adapted to selectively decouple the CP from the power source when a load imposed on the filter by a demanding device is under a given threshold.

Thus, as the charge pump is decoupled from the power source, the output capacitor may still output a voltage. Further, if, in a following instant, a high load, or even an unusually high load, may be requested from the output capacitor, the charge pump may be recoupled to the power supply and may provide sufficient current and/or voltage to meet the load. Further, as the voltage output from the capacitor is already high there is a reduced delay between the request for a high load and the output of current and voltage from the charge pump assembly. As long as the charge pump operates according to a charging mode and is not be adapted to output current and/or voltage, the output capacitor may output at least part of the requested current and/or voltage.

In particular, the threshold may be chosen so as to represent a load that would deplete only 10% or 5% or 2% or 1% of a charge initially present in the output capacitor as the charge pump is decoupled from the power source. The threshold may be chosen with a security margin. A security margin of 1% may be added while defining the threshold.

In an embodiment, the controller may be further adapted to couple the CP to the power source if the filtered voltage is less than or equal to a given voltage threshold.

Thus, the charge pump assembly may be configured so as to make sure that a high enough voltage is present in the output capacitor at all times. Thus, the charge pump assembly may be able to meet a request for an unusually high load even when the charge pump is coupled or decoupled from the power supply in the instant before the unusually high load is requested.

In some embodiments the value of the load imposed on the filter may depend on an input load control signal. The circuit may then comprise an analyzer configured to analyze the command input signal. Further, the analyzer may be adapted to estimate whether the load is below the selected threshold and control the controller accordingly.

Therefore, the disclosure enables estimation of the load before the load is imposed on the charge pump. Indeed, the analyzer may issue the control signal based on the load control signal and not based on the load itself. Accordingly, orders contained in the control signal may be processed by the controller at the same time that the load control signal controls the load. Such simultaneous action enables reduction of the power consumption of the charge pump as the charge pump may be decoupled from its power supply without any delay, and less security margin is needed. Thus, the load threshold under which the CP is decoupled from the power supply may be raised.

In some cases, the input load control signal is a digital audio load control signal comprising a series of sampled values.

The analyzer may further be adapted to estimate the value of the load imposed on the CP based on at least one sampled value of the load control signal. Thus the load may not be overestimated and smaller margins may be desired for controlling decouplings of the CP and the power supply.

The analyzer may be adapted to output a control signal, for a given digital load control signal sample, according to which the controller alternatively couples and decouples the CP and the power source. In this way, the load threshold may be raised again. In some embodiment, the load threshold may be raised such that the charge pump is decoupled at least a bit for almost all load control signal sampled values.

For the duration of a sampled value of load control signal, the charge pump may thus be coupled to the power supply only as much as needed by the expected load.

The device may also include a demanding device supplied both from the charge pump assembly and directly from the power source, with the filtering voltage having an opposite sign to a voltage output by the power source. Then, the demanding device may be advantageously controlled by a load control signal and impose a load on the charge pump assembly according to the load control signal.

The demanding device may be an audio amplifier. In such case, the device of the disclosure may be used for emitting audio signal to speakers such as headphone speakers.

This disclosure is also related to a method for outputting a filtered voltage out of a charge pump assembly, CPA. The method may include estimating a load imposed on the CPA, and decoupling the CPA from a power source using a controller.

According to an embodiment, the controller may decouple the CPA from the power source when the load is less than a given threshold. Further, it may recouple the CPA to the power source when the load is greater than the threshold.

In some embodiments, estimating the load may include analyzing a part of a load control signal that controls a demanding device, which imposes the load on the CPA, and sending a control signal to the controller so as to selectively decouple or couple the CPA to the power source depending on the load, roughly simultaneously with an operation of the demanding device according to the part of the load control signal.

The load control signal may be a digital load control signal output comprising load control signal sampled values, each load control signal sampled value corresponding to a given duration of the load control signal (the sampling duration). In such case, the analyzer may estimate the load that may be imposed by the demanding device were it operating under influence of the load control signal sampled value.

In some embodiments, the control signal for the duration of the sampling duration may be a PWM signal according to which the controller successively couples and decouples the CPA and the power source in a single sampling duration, such that the CPA is coupled to the power source to replenish an output capacitor positioned in parallel in-between the CPA and the demanding device, with desires of the load being met by charges stored into the output capacitor by the CPA.

In such ways, these methods enable decoupling, even if for a small sub-period of a sampling duration, the CPA from the power source for most sampled values of the load control signal. Accordingly, the methods of this disclosure allow power consumption of the charge pump for most load control signal sampled values to be reduced.

The load may be estimated accurately for any sub-period of the sampling duration. In such a case, the control signal may be a PWM signal according to which the controller decouples the CPA from the power source when the load is low, and couples the CPA and the power source when the load is higher in a single sampling duration. Thus, the control of the coupling of the CPA to the power supply may be greater and the power may be transmitted from the power supply to the CPA in a most efficient way.

The load imposed on the CPA may be imposed by an audio amplifier which draws power with a negative voltage from the CPA and with a positive voltage from the power source according to a load control signal issued from an audio codec converter.

An aspect relates to a computer program product comprising one or more sequences of instructions stored on non-transitory media that are accessible to a processor and which, when executed by the processor, cause the processor to carry out the methods of this disclosure.

BRIEF DESCRIPTION OF THE DRAWINGS

Embodiments of the present disclosure are illustrated by way of example, and not by way of limitation, in the figures of the accompanying drawings, in which like reference numerals refer to similar elements and in which.

DETAILED DESCRIPTION

Figure 1:
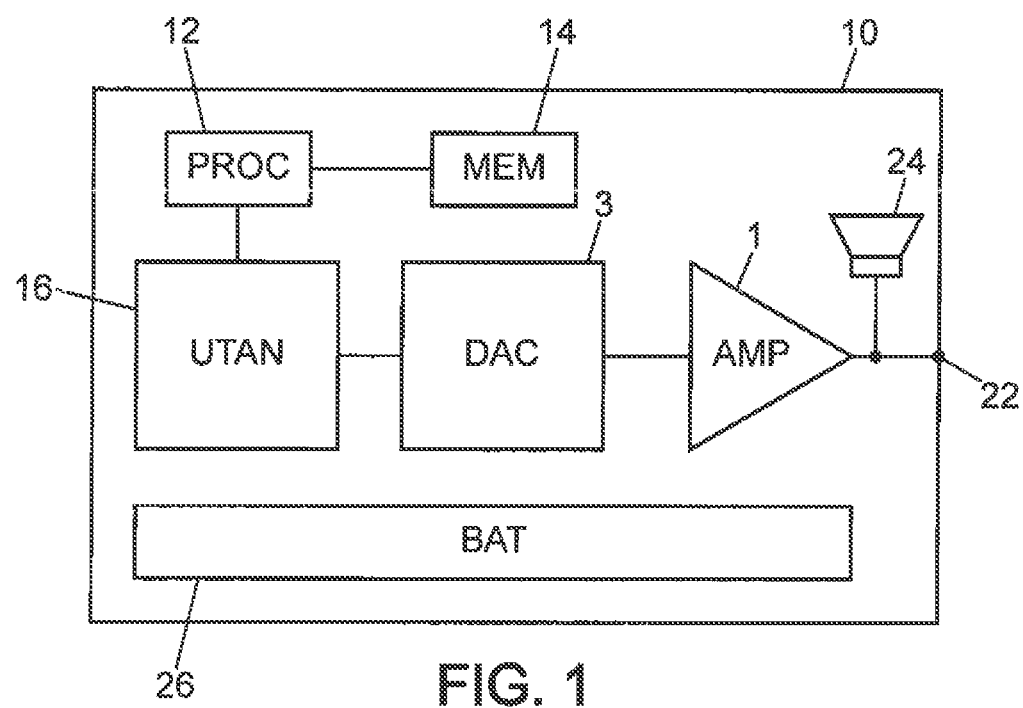
FIG. 1 is a schematic diagram of a mobile audio device.

The following sections discuss, for illustrative purposes and as represented in FIG. 1, an example of a mobile device 10 comprising a processor (PROC) 12 coupled to storage (MEM) 14, such as a rewritable solid-state drive assembly, and random access memory. The mobile device 10 may include a digital audio data processing unit (VTAN) 16, able to read, decode, and apply audio processing to audio data, and in particular to audio data stored in the storage. The digital audio data processing unit may output a stream of digital audio data. The mobile device 10 may include a digital-to-analog converter 3, DAC, for converting the stream of digital audio data into an analog audio signal. The analog audio signal may be amplified by an audio amplifier (AMP) 1 delivering an amplified audio signal to an internal sound reproduction system 24 and/or an audio output 22 able to be coupled to an external sound reproduction device.

As a non-limiting example, the mobile device 10 can be a mobile telephone, in which the audio output 22 is a female headset jack connector. The sound reproduction device 24 can, for example, be an audio headset or an external speaker.

The mobile device 10 may include a power supply (BAT) 26 for powering the components of the device 10, particularly the amplifier 1, and optionally the digital-to-analog converter 3. The power supply 26 may have a positive output and a negative output, for example respectively delivering a DC voltage of 2V and −2V. The negative output may be produced by a charge pump assembly. Thus, the amplifier 1 may receive a DC voltage of 2V on one input, and a DC voltage of −2V on another input.

The disclosure is also related to a method for managing a charge pump assembly circuit for audio application in order to reduce a quiescent current consummated by the charge pump assembly.

Figure 2:
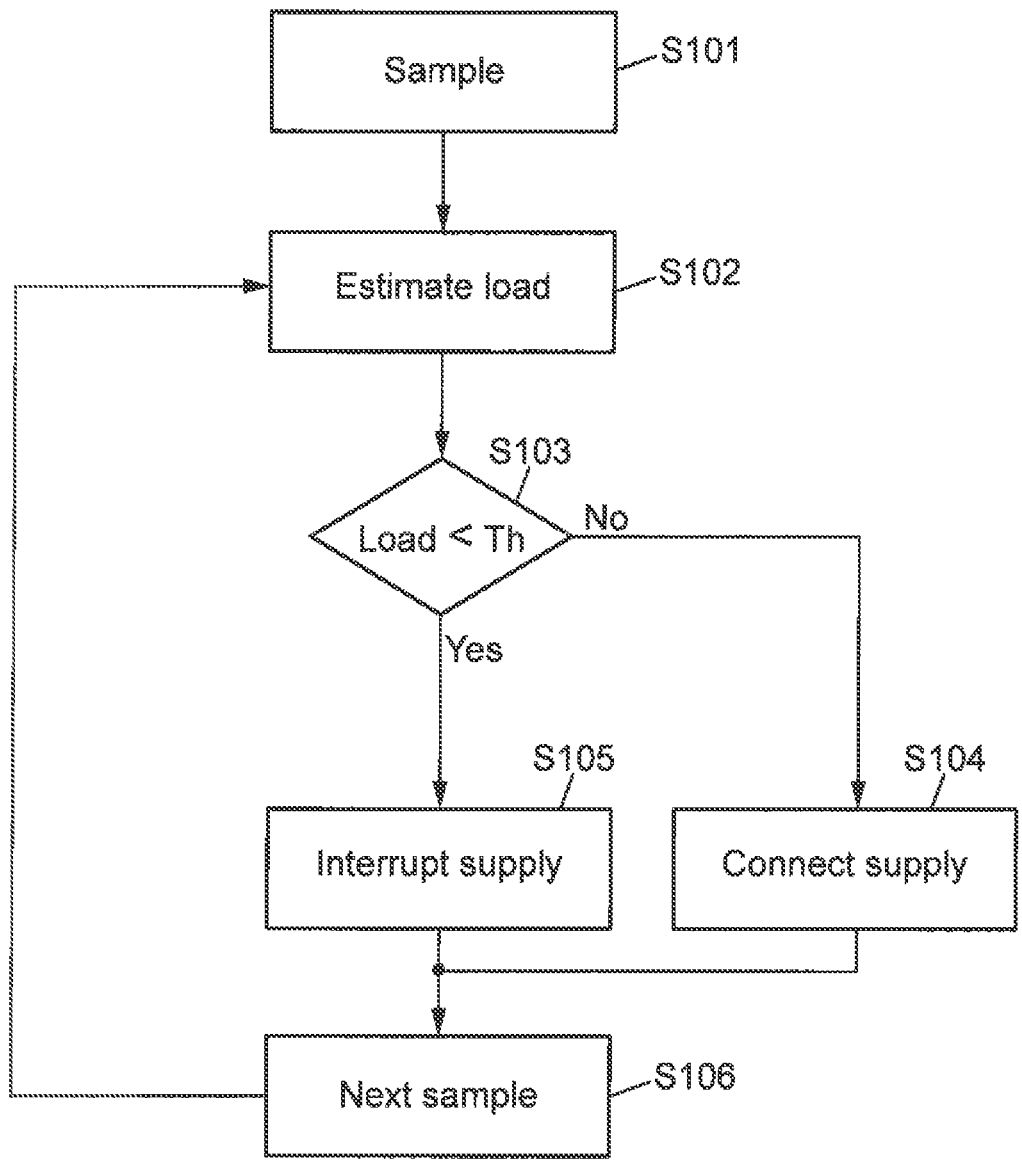
FIG. 2 is a flow chart illustrating steps of a method of analyzing a load control signal sampled value according to an embodiment of the disclosure in which the load is estimated by peak detection.

This method includes a sampling operation S101, in which a load control signal sampled value is selected (FIG. 2). The load control signal sampled value is a sampled value of a load control signal configured to control a demanding device (e.g. an amplifier such as an audio amplifier) into outputting a signal to an output. The signal may be an audio load control signal and the output may be coupled to speakers. The load control signal may be stored into a memory in a digital form. To a sampled value corresponds a sampling duration, duration of a signal emitted by a DAC processing the sampled value of the load control signal.

Further, in an operation S102, the load control signal sampled value may be analyzed by an analyzer in order to estimate the load imposed by the amplifier on the charge pump as it processes the load control signal.

Then, in an operation S103, the load (operation S104) be analyzed. If the load is greater than a load threshold, the analyzer may issue a control signal to a controller to couple the charge pump assembly to a power source or maintain such coupling.

Conversely, if, in operation S103, the load is found to be smaller than the load threshold, the analyzer may issue a control signal to the controller to start an OFF phase operation of the charge pump (S105) by decoupling the charge pump assembly from the power source. Thus, the controller may interrupt the power supply of the charge pump assembly.

Thereafter, a next sampled value is selected by the analyzer 6 (operation S106) and the process may be repeated.

Figure 3:
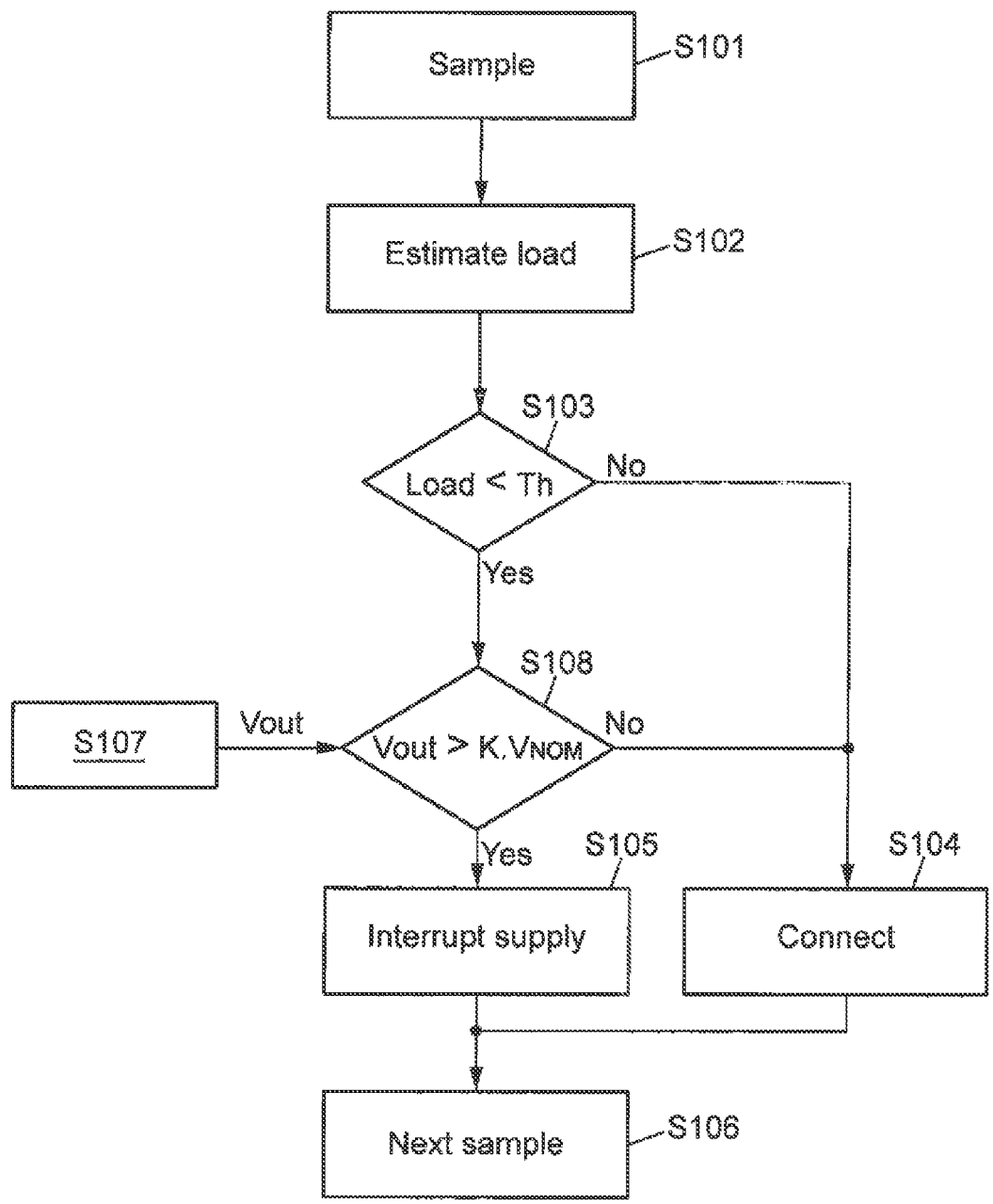
FIG. 3 is a flow chart illustrating steps of a method according to a further embodiment of the disclosure in which the filtered voltage is taken into account.

FIG. 3 illustrates a further embodiment of the process of the disclosure. Operations S101 to S105 are similar to the ones illustrated with respect to FIG. 2.

Further, in an operation S107, a filtered voltage output by the charge pump assembly is estimated. The filtered voltage may be estimated by monitoring the filtered voltage, or by computing an anticipated filtered voltage based on a filtered voltage output at the beginning of a previous sampling duration and a load imposed during the previous sampling duration or by any other means.

In case a control signal for decoupling the charge pump assembly from the power source is issued from S103, in a comparing operation S108, it is estimated if the filtered voltage Vout is greater than a filtered voltage threshold value $K \cdot V_{nom}$. If the comparison has a positive result, the controller decouples the charge pump assembly and the voltage source (S105). If the comparison's result is negative, the controller starts an ON phase of the charge pump by coupling the charge pump assembly to the voltage source (S104). In the illustrative embodiment the filtered threshold value is chosen as a factor of a nominal value of the filtered voltage. Such a value may be defined as the filtered voltage value when the charge pump is in an ON phase and no load is imposed on the charge pump.

Thereafter, a next sampled value is selected by the analyzer (S106) and the process may be repeated.

Figure 4:
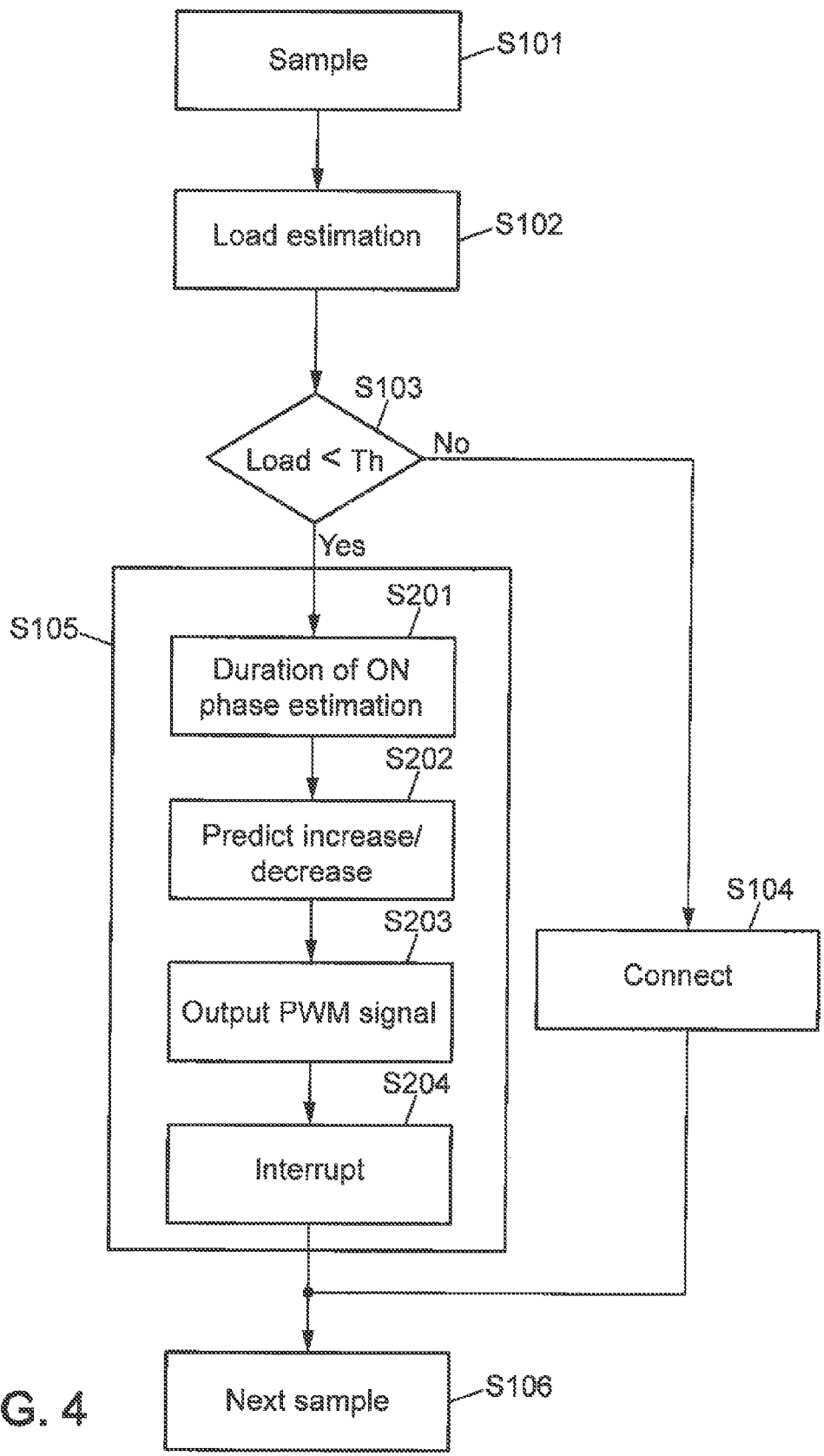
FIG. 4 is a flow chart illustrating steps of a method according to a further embodiment of the present disclosure in which the control signal is a PWM signal.

In a further embodiment of the process of the disclosure, as described in FIG. 4, the operation S105 in which the power source and the charge pump assembly are decoupled comprises at least an operation S201 of computing a duration of the ON phase to meet the load. Indeed, with the load being finite and being smaller than an unusual load, there exists a duration smaller than a sampling duration sufficient for the charge pump in an ON phase to output enough power to meet the load.

Further, as explicated further along in the description, the analyzer may predict if the load might increase or decrease by comparing with the load of a previous sampling duration (step 202). Accordingly, the analyzer may define if the ON phase is to be started at the end or at the beginning of the sample duration.

As a further security step, the load used for determining the ON phase and OFF phase may chosen so as to be the greater load of the current sampled value and a sampled value immediately preceding.

Operation S105 may further comprise an operation S203 of outputting the PWM control signal to the controller in order to successively decouple and couple the charge pump assembly and the power source during one sampling duration.

Thus, according to the processes of the disclosure, depending on a load imposed on the charge pump by a demanding device, a controller interrupts (S204), or not, a coupling of the charge pump assembly to a power source. In audio devices, the load may be imposed by a headphone amplifier.

In order to synchronize the power supply interruptions with the corresponding load, circuitry may be used in order to estimate the load before it is imposed on the charge pump assembly.

This circuitry may comprise an analyzer that analyzes a load control signal sent to the demanding device. The load control signal may drive the load by controlling the demanding device. Further, the analyzer may control the controller by transmitting it to a control signal. In turn the controller either decouples or re-couples the charge pump and the power source.

Accordingly, if the load control signal is digital, it may include sampled values forming samples. The samples define a sampling duration corresponding to a given duration of the load control signal once the load control signal sample is processed by a DAC.

In one embodiment, the load control signal may be submitted to a peak analysis of the load control signal in an analog form. If the value of the load control signal is below the threshold then the analyzer may send a control signal for starting an OFF phase of the charge pump for as long as the load control signal is inferior to the threshold. In such case, the load control signal output by the DAC may be checked. A peak analysis is done easily and thus a small computing power is used for the analyzer.

Alternatively, the load may be calculated based on the sampled value of the load control signal.

The estimated load may be used to determine a control signal enabling to decouple or recouple the power source and the charge pump assembly.

Depending on the embodiments, different kinds of control signal may be issued to the controller.

In a first embodiment, called a binary embodiment, the load, either determined by peak analysis or by load estimation, may be compared to a given threshold. If the load is less than the threshold, the analyzer may send a control signal for decoupling the charge pump assembly from the power source for the whole sampling duration.

In a further embodiment of the binary embodiment, the analyzer, and/or the controller, may be designed to maintain, in a given voltage range, the filtered voltage output by the charge pump assembly while the coupling to the power source is interrupted.

In a first variant described above in operations S107 and S108 of FIG. 3, the filtered voltage may be monitored and the coupling to the power source is restored if the filtered voltage reaches a given filtered voltage threshold value or a given ratio of the nominal voltage.

In a second variant, the number of consecutive sampling durations for which the charge pump assembly is decoupled from the power source may be limited in number by design. Accordingly, the circuit may be configured so that each sampling duration during which the charge pump is in an OFF phase is followed by a sampling duration during which the charge pump is in an ON phase. As an example, a control signal for re-coupling the charge pump assembly to the power source may be output by the analyzer for each load control signal sampled value that follows a sampled value that led the analyzer to issue a control signal for interrupting the coupling to the power supply. Alternatively, a recoupling control signal may be output every two, three, five or more consecutive sampled values that have led to a decoupling of the charge pump assembly's power supply. The recoupling control signal may be sent independently of the value of the load according to the following sampled value of the load control signal.

In some cases, the recoupling may be accomplished directly by the controller, independently of the control signal.

In one illustrative embodiment, the analyzer may not take into account the number of successive sampling durations during which the charge pump is in an OFF phase. However, the controller is arranged or programmed to automatically proceed to the aforementioned recoupling.

In a further embodiment, each sampling duration may start by putting the charge pump assembly in an ON phase for a given time notwithstanding the value of the load. If for the sampling duration the load is less than the load threshold, the charge pump assembly may be decoupled from the power source after the given time.

Accordingly, as the analyzer identifies a load that is smaller than the load threshold, the controller may start the sampling duration with an ON phase of the charge pump for a given time. Thereafter, it starts an OFF phase of the charge pump for the remaining of the sampling duration, according to the control signal issued by the analyzer.

The controller may be programmed to respond to a control signal for starting an OFF phase with a given delay. Alternatively, the analyzer may be programmed to deliver a control signal to the charge pump wherein parts of the signal impose an ON phase and parts of the signal impose an OFF phase. In such case, the control signal may instruct the controller to start a sampling duration by coupling first the charge pump assembly and the power source and at a further moment decoupling both elements.

Alternatively, the circuit may by configured so that the charge pump is in an ON phase at the end of the sampling duration, with the OFF phase beginning the sampling duration.

The respective duration of the ON phase and of the OFF phase may be computed by the analyzer based on the determined load.

The PWM signal may be designed so that the duration of the ON phase allows the charge pump to output enough charge to the output capacitor so as to compensate for the charge consumed by the load. Further, the PWM signal may be designed so that the duration of the ON phase is as small as possible given the statement above.

If the load is estimated by use of a digital analyzer, the digital analyzer may use the former sampled values to estimate a prediction of the accurate load imposed by the demanding device on the charge pump. Indeed, the load for any sub-division of a sampling period, once the digital load control signal is translated into an analog control signal, may be a rough time-average of the sampled values. Accordingly, it is possible to estimate the evolution of the load during a given sampling duration.

Thus, the PWM signal may be devised with an ON phase at the beginning of the sampling duration if it is estimated that the load may decrease during the sample duration. Conversely, the PWM signal may be devised with an ON phase at the end of the sampling duration if it is estimated that the load may increase during the sample duration.

In some embodiments, the duration of the ON phase may be higher than the cumulated duration of a charging mode and a discharging mode of the charge pump. Thus, during an ON phase the charge pump may fulfil at least one full charging mode and at least a full discharging mode.

As an alternate security measure, the load used for determining the duration of the ON phase and OFF phase may be chosen so as to be the greater load between the load estimated for the current sampled value and the load estimated for an immediately preceeding sampled value. Such computing may be done more easily if the analyzer is a digital analyzer.

The processes of the disclosure may be carried out by different electronic devices. Alternatively, it may be carried out by a digital device having a memory to store data such as the threshold values and a processor programmed to carry out comparison operations and to estimate the load out of a digital sampled value. Those of skill in the art will understand how to configure the processor to carry the comparison operations and how to estimate the loud out of the digital samples load.

Alternatively, the process may be carried out by an electronic device without any digital component.

In one such embodiment, the load may be estimated by analyzing an analog load control signal, such as one issued from the DAC.

Figure 5:
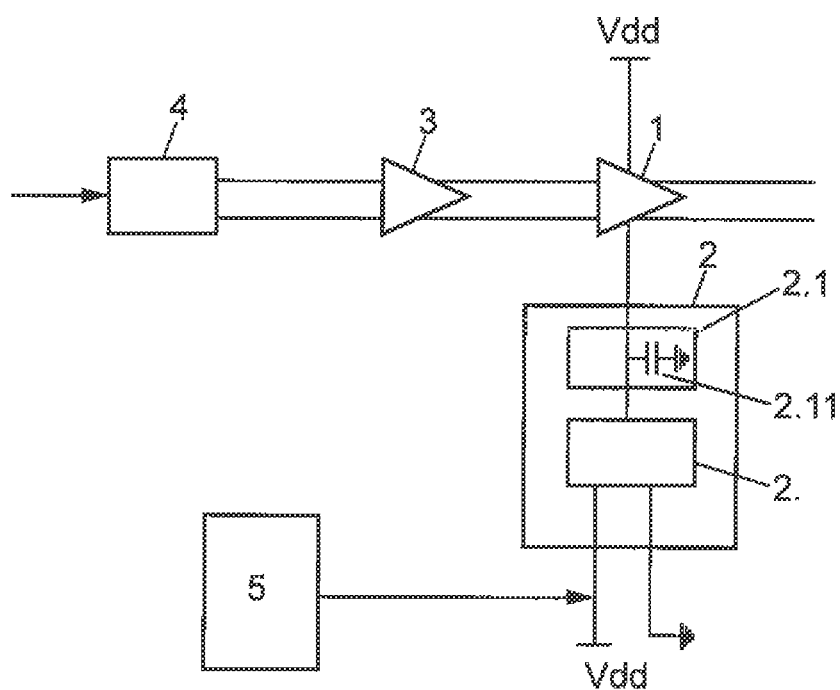
FIG. 5 is a schematic diagram of a first embodiment of the disclosure.

Referring to FIG. 5, there is shown therein a schematic view of an embodiment of a device according to the disclosure.

An audio device is illustrated on FIG. 5. It comprises an amplifier 1, supplied with a first voltage Vdd from a power source, and a second voltage, opposite in sign to the first voltage, issued by a charge pump assembly 2.

The charge pump assembly 2 may comprise a low pass filter 2.1 and a charge pump 2.2. The low pass filter itself may have an output capacitor 2.11. The charge pump may be supplied by the power source with the first voltage Vdd. In the case of an audio device, as stated above, the amplifier 1 may be a headphone amplifier, adapted to supply an audio signal to one or more speakers. However, for the charge pump assembly, the amplifier 1 may act mainly is as a demanding device that may impose a load on the charge pump assembly.

The amplifier 1 is, in this illustrative embodiment, controlled by a DAC 3. The DAC 3 is inputted with a digital load control signal comprising sampled values and outputs an analog load control signal to the amplifier 1.

An audio codec converter 4 may be adapted to output the digital load control signal issued to the DAC 3 by accessing stored data.

Further, a controller 5 may be adapted to selectively decouple the charge pump assembly 2 from the power source. Thus, the controller 5 may be adapted to interrupt the power supply of the charge pump.

The controller 5 may be adapted to decouple the charge pump assembly 2 from the power source depending on a load imposed on the charge pump assembly 2 by the amplifier 1. In particular, the controller 5 may be configured to put the charge pump in an OFF phase when the load is less than or equal to a given load threshold.

The load threshold may be chosen according to one of many rules. In particular, it may be estimated by choosing a given maximal value of negative voltage needed by the amplifier 1. Alternatively, the load threshold may be precisely defined as a load value. The load threshold may be a zero load value or it may be a given value of the load. In particular, the given value of the load may be determined as a load that may not deplete the charge in the output capacitor in the whole duration of a single sampling duration. The load threshold may be chosen as a load value that may impose a depletion of less than 1%, 2%, 5%, 10%, or even up to 20% of the output capacitor's charge during the sampling duration. The load threshold may be chosen according to other rules.

Further, the controller 5 may be adapted to couple the charge pump assembly to the power source if the load imposed on the charge pump assembly 2 is higher than the load threshold.

In some applications, a charge pump assembly 2 may cycle through charging modes charging a first capacitor and discharging modes in which the first capacitor is discharged into the low pass filter 2.1.

The low pass filter 2.1, and the output capacitor 2.11 may discontinuously receive charges from the charge pump. Indeed, the charges may be mostly transmitted during the discharging mode. However, the output capacitor 2.11 may continuously output a voltage, named filtered voltage, which is roughly a window timed average of the voltages output by the charge pump 2.2.

As the charge pump assembly is coupled to the power source, and no load is imposed on the charge pump assembly, the filtered voltage may be roughly constant and defines a nominal voltage.

If the amplifier 1 imposes a load to the charge pump assembly 2, it may drain power from the output capacitor 2.11 and consumes the charge present in the output capacitor. Here, the charge pump and its capacitor may be switching between the charging mode and the discharging mode with a switching frequency and it replenishes the charge in the output capacitor as fast as the load consumes it even in the case of an unusually high load.

On one hand, this allows the filtered voltage output by the output capacitor to be roughly equal to the nominal voltage whatever the load imposed on the charge pump; on the other hand, a high enough switching frequency imposes a quiescent current on the charge pump.

According to the disclosure, the charge pump's power supply may be selectively interrupted for a given duration. In such case, the charge pump 2.2 may be stopped and may not charge the first capacitor for the given duration. As long as the charge pump 2.2 is in an OFF phase and not supplied by power, no quiescent current is consumed by the charge pump 2.2. However, the output capacitor 2.11 still outputs a voltage that depends on the charge present in the output capacitor at the time the power supply is interrupted. Thus, the charge pump assembly may output a filtered voltage even as the charge pump is in an OFF phase.

Thus, the total quiescent current needed for outputting a negative voltage may be greatly reduced.

If no load is further imposed on the charge pump assembly 2, the charge of the output capacitor 2.11 may not diminish and the filtered voltage remains roughly constant.

Conversely, a load may be imposed on the charge pump assembly during an OFF phase of the charge pump. The charge of the output capacitor 2.11 may diminish to meet the demand imposed by the load and not be replenished by the charge pump. The filtered voltage output by the output capacitor 2.11 may decrease as the charge is consumed and power is transmitted to the load. The filtered voltage decreases quicker as the load is more important.

Figure 6A:
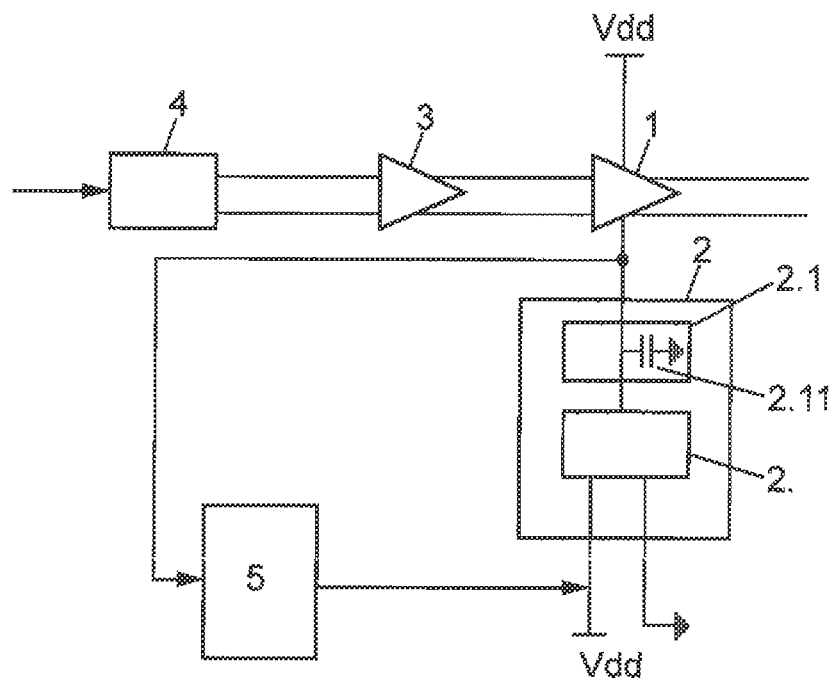
FIGS. 6A and 6B are a schematic diagram of two further embodiments of the disclosure.

In an embodiment of the disclosure, illustrated in FIG. 6A, the controller 5 may be adapted to monitor the output of the charge pump assembly 2. The controller 5 may decouple the charge pump assembly 2 from the power supply if the load imposed on the charge pump assembly becomes smaller than a given load threshold.

Figure 6B:
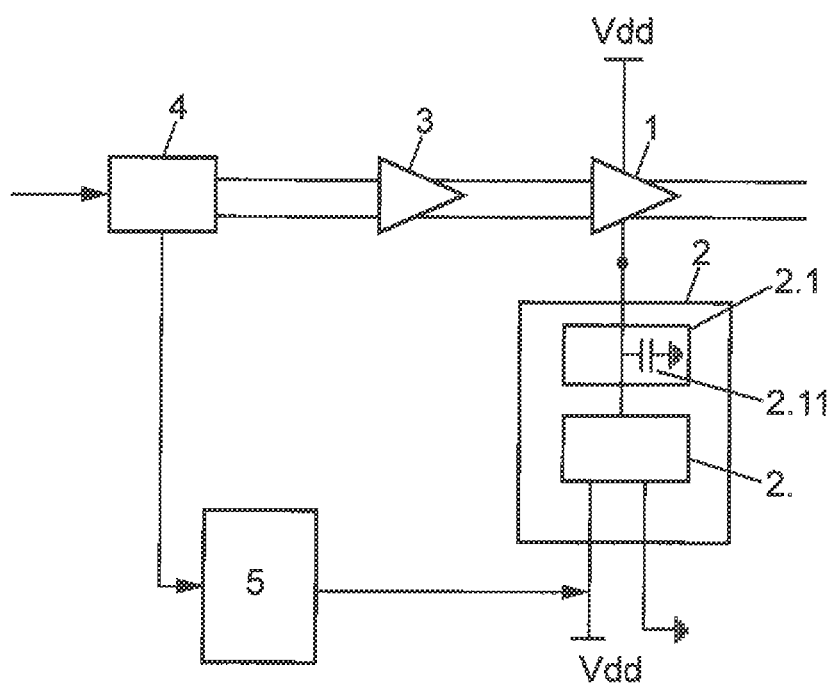

According a further embodiment of the disclosure, illustrated in FIG. 6B, the audio codec converter 4 may be adapted to convert stored data into a load control signal comprising sampled values, which accordingly define samples. The audio codec converter 4 may further comprise an analyzer adapted to analyze the load control signal and in particular its sampled values. The analyzer estimates whether the load imposed by the amplifier while operating according to the sampled value of the load control signal might be under the load threshold or not. The analyzer may be further adapted to transmit a control signal to the controller 5. The controller 5 may be adapted to interrupt or not, based on the control signal, the power supply of the charge pump assembly 2.

As stated above, a given load control signal sampled value corresponds to a sampling duration, representing the duration of a signal output by the audio codec converter 3 for one sampled value before switching to another sampled value. The sample duration may be of about 22.7 μs for a sampling frequency of 44 KHz.

As stated above in the description of the methods according to the disclosure, the analyzer 6 may estimate a maximal load imposed on the charge pump assembly 2 by a peak analysis of the load control signal as the signal is in an analog form.

Accordingly, the analyzer 6 may send a control signal enabling an OFF phase of the charge pump if the voltage of the load control signal is reaches a corresponding load control signal voltage threshold. The load control signal voltage threshold is indicative of a corresponding load threshold.

Alternatively, the analyzer 6 may be a digital analyzer and may estimate the load by computing the load that may be imposed on the charge pump assembly by the amplifier 1 operating according to the load control signal.

The analyzer 6 is adapted to transmit a control signal to partially or totally interrupt the power supply of the charge pump assembly 2 if the estimated load imposed on the charge pump is lower than the load threshold.

Thus, as the load is estimated by the analyzer 6, the threshold the analyzer may base the control signal on may be a load threshold value. The load threshold may be computed based on the switching frequency of the charge pump and based on the charge that can be stored in the output capacitor. The load threshold may therefore be a value corresponding to a load that would impose a depletion of 1%, 2%, 5%, 10% or even up to 20% of the output capacitor's charge during a given sampling duration.

The analyzer 6 may further be adapted to estimate in detail the load that may be imposed on the charge pump assembly 2 for any subdivision of the sampling duration. The analyzer 6 may thus output a PWM load control signal for interrupting selectively the power supply of the charge pump assembly 2.

In one embodiment, called binary embodiment, the analyzer 6 may be adapted to issue a control signal for interrupting the power supply of the charge pump assembly, for the whole sampling duration.

In another embodiment, the analyzer 6 may be adapted to issue a control signal for partially interrupting the supply of the charge pump during a sampling duration and partially couple the power supply to the charge pump. Thus, the analyzer may output a PWM control signal for creating ON phases and OFF phases for the charge pump assembly during a sampling duration for some samples.

Thus, during one sampling duration, the charge pump assembly may be decoupled from the power supply for a part of the sampling duration and coupled to it for another part of the sampling duration.

However, it is to be noted that for some samples, such as samples which imposes no load or conversely which impose a relatively important load, the ON phase or the OFF phase may be suppressed.

Advantageously, the PWM control signal may be designed by the analyzer 6 so that, at the end of the sampling duration, the filtered voltage is comprised between the nominal voltage and a filtered voltage threshold value. The filtered voltage threshold value may be a fraction of the nominal voltage, for example, 80%, 90%, 95% or even 99% of the nominal voltage value.

In a variant, the controller may be arranged to monitor the filtered voltage and to start an ON phase of the charge pump if the filtered voltage is less than the filtered voltage threshold value independently of the control signal.

To better understand this embodiment, illustrative values are hereby presented. A charge pump assembly may output a nominal voltage of −2V. The sampling duration of the signal output by the audio codec converter may correspond to a 10 μs if the sampling frequency is of around 100 KHz.

The switching frequency of the charge pump may be superior or equal to 2 MHz. In such case, a charging (or discharging) mode of the charge pump may have a duration inferior or equal to 0.5 μs. If the maximal voltage from the charge pump for the sampling duration is close to −0.1V, the load imposed on the charge pump may be small. The analyzer 6 may estimate desired load and it would output a control signal to the controller according to which the charge pump assembly 2 is to be in an ON phase for g. 1 μs out of 10 μs and in an OFF phase for the remaining 9 μs.

Conversely, if the analyzer 6 estimates a maximal voltage needed from the charge pump assembly close to −1.5V, it may output a control signal to the controller according to which the charge pump is to be in an ON phase for 9 μs and in an OFF phase for 1 μs.

In a further embodiment of the disclosure, the controller 5 may be adapted to stop the OFF phase of the charge pump assembly based on a voltage value of the output of the charge pump assembly 2. In one illustrative embodiment, the charge pump assembly 2 has a nominal output voltage of −2V. In that case, the threshold voltage value may be −1.8V or −1.9V.

The values given above are only illustrative and do not limit the scope of the disclosure. Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present disclosure, it will be understood by those skilled in the art that various other modifications may be made, and equivalents may be substituted, without departing from the true scope of the present disclosure. Additionally, many modifications may be made to adapt a particular situation to the teachings of the present disclosure without departing from the central inventive concept described herein. Furthermore, an embodiment of the present disclosure may not include all of the features described above. Therefore, it is intended that the present disclosure not be limited to the particular embodiments disclosed, but that the disclosure include all embodiments falling within the scope of the appended claims.

A person skilled in the art will readily appreciate that various parameters disclosed in the description may be modified and that various embodiments disclosed and/or claimed may be combined without departing from the scope of the disclosure.

It is stipulated that the reference signs in the claims do not limit the scope of the claims, but are merely inserted to enhance the legibility of the claims.

The invention claimed is:

1. A voltage supply comprising:
   a charge pump coupled to a power source and configured to output a pulse-width modulated voltage based upon an input voltage from the power source;
   a low-pass filter comprising an output capacitor, the output capacitor configured to average the pulsed-width modulated voltage and output a filtered voltage having a value different than that of the input voltage;
   a controller configured to selectively decouple the charge pump from the power source when a load imposed on the low-pass filter is below a threshold load, the load imposed on the low-pass filter being based upon a load control signal, the load control signal comprising a digital signal, the digital signal comprising a series of sampled values;
   an analyzer configured to analyze the load control signal, estimate whether the load is below the threshold load, and selectively operate the controller based upon the estimate of whether the load is below the threshold load.

2. The voltage supply of claim 1, wherein the controller is configured to couple the charge pump to the power source when the filtered voltage is less than or equal to a threshold voltage.

3. The voltage supply of claim 1, wherein the analyzer is configured to estimate a value of the load based on at least one sampled value of the series thereof.

4. The voltage supply of claim 1, wherein the threshold load represents a load that would deplete at least 1% of charge initially present in the output capacitor as the charge pump is decoupled from the power source.

5. The voltage supply of claim 1, wherein the threshold load represents a load that would deplete at least 2% of charge initially present in the output capacitor as the charge pump is decoupled from the power source.

6. The voltage supply of claim 1, wherein the threshold load represents a load that would deplete at least 5% of charge initially present in the output capacitor as the charge pump is decoupled from the power source.

7. The voltage supply of claim 1, wherein the threshold load represents a load that would deplete at least 10% of charge initially present in the output capacitor as the charge pump is decoupled from the power source.

8. An electronic device to be associated with a demanding device that imposes a load based upon a load control signal, the electronic device, comprising:
   a power source;
   a charge pump coupled to the power source and configured to output a pulse-width modulated voltage based upon an input voltage from the power source;
   a low-pass filter and comprising an output capacitor, the output capacitor being configured to average the pulsed-width modulated voltage and to output a filtered voltage having a value different than that of the input voltage and opposite in sign to the input voltage, the filtered voltage to serve the load imposed on the low-pass filter by the demanding device; and
   a controller configured to selectively decouple the charge pump from the power source when the load imposed on the low-pass filter by the demanding device is below a threshold load, the load imposed on the low-pass filter being based upon a load control signal, the load control signal comprising a digital signal, the digital signal comprising a series of sampled values;
   an analyzer configured to analyze the load control signal, estimate whether the load is below the threshold load, and selectively operate the controller based upon the estimate of whether the load is below the threshold load.

9. The electronic device of claim 8, wherein the demanding device is an audio amplifier.

10. An article, comprising:
    a charge pump configured to output a modulated voltage based upon an input voltage;
    a low-pass filter configured to average the modulated voltage and to output a filtered voltage having a value different than that of the input voltage; and
    a controller configured to selectively decouple the charge pump from the input voltage when a load imposed on the low-pass filter is below a threshold load, the load imposed on the low-pass filter being based upon a load control signal, the load control signal comprising a digital signal, the digital signal comprising a series of sampled values;
    an analyzer configured to analyze the load control signal, estimate whether the load is below the threshold load, and selectively operate the controller based upon the estimate of whether the load is below the threshold load.

11. The article of claim 10, wherein the controller is configured to couple the charge pump to the input voltage if the filtered voltage less than or equal to a threshold voltage.

12. The article of claim 10, wherein the analyzer is configured to estimate a value of the load based on at least one sampled value of the series thereof.

13. A method for outputting a filtered voltage from a charge pump, and comprising:
    estimating a load imposed on the charge pump;
    decoupling the charge pump from a power source based upon the load being less than or equal to a threshold load, using a controller;
    recoupling the charge pump to the power source based upon the load being greater than the threshold level, using the controller;
    wherein estimating the load comprises:
        analyzing a load control signal that controls a demanding device which imposes the load on the charge pump, using an analyzer, the load control signal comprising a digital load control signal, the digital load signal comprising a series of sampled values, analyzing the load control signal comprising estimating the load that would be imposed by the demanding device were it operating under influence of at least one sample value of the series thereof; and
        sending a control signal to the controller so as to cause the controller to selectively couple the charge pump to the power source substantially simultaneously with control of the demanding device based upon at least part of the load control signal.

14. The method of claim 13, wherein the load imposed on the charge pump is imposed by an audio amplifier, the audio amplifier to draw power with a negative voltage from the charge pump and to power with a positive voltage from the power source, based upon a load control signal received from an audio codec converter.

15. A method of operating an electronic device, comprising:
    outputting a pulse-width modulated voltage based upon an input voltage from a power source, using a charge pump;
    imposing a load on a low-pass filter comprising an output capacitor, and configuring the output capacitor to average the pulsed-width modulated voltage and output a filtered voltage having a value different than that of the input voltage, the load imposed on the low-pass filter being based upon a load control signal, the load control signal comprising a digital signal, the digital signal comprising a series of sampled values;

selectively decoupling the charge pump from the power source when the load imposed on the low-pass filter is below a threshold load, using a controller;

analyzing the load control signal and estimating whether the load is below the threshold load, using an analyzer; and selectively operating the controller based upon the estimate of whether the load is below the threshold load.

16. The method of claim 15, further comprising coupling the charge pump to the power source when the filtered voltage is less than or equal to the threshold voltage, using the controller.

17. The method of claim 15, further comprising estimating a value of the load based on at least one sampled value of the series thereof, using the analyser.

* * * * *